United States Patent
Zhu

(10) Patent No.: US 11,862,534 B2
(45) Date of Patent: Jan. 2, 2024

(54) ADJUSTABLE HEAT EXCHANGER

(71) Applicant: Xiamen youbaishi Electronic Technology Co., Ltd, Xiamen (CN)

(72) Inventor: Zonghu Zhu, Xiamen (CN)

(*) Notice: Subject to any disclaimer, the term of this patent is extended or adjusted under 35 U.S.C. 154(b) by 0 days.

(21) Appl. No.: 17/498,814

(22) Filed: Oct. 12, 2021

(65) Prior Publication Data
US 2023/0086458 A1    Mar. 23, 2023

(51) Int. Cl.
H05K 7/20 (2006.01)
H01L 23/467 (2006.01)
H01L 23/38 (2006.01)

(52) U.S. Cl.
CPC ............ *H01L 23/467* (2013.01); *H01L 23/38* (2013.01); *H05K 7/20409* (2013.01)

(58) Field of Classification Search
CPC ....... H01L 23/467; H01L 23/38; H01L 23/40; H01L 23/46; H01L 23/4039; H01L 2924/00; H01L 23/4006; F25B 21/02; H05K 7/20172; H05K 7/20154; H05K 7/20509; H05K 7/2049; H05K 7/20472; H05K 7/20454; H05K 7/20445; H05K 7/20436; H05K 7/20418; H05K 7/2039; G06F 2200/203; F21V 29/54; F21V 29/70; F21V 29/73; F21V 29/74
See application file for complete search history.

(56) References Cited

U.S. PATENT DOCUMENTS

| | | | |
|---|---|---|---|
| 2,798,494 A * | 7/1957 | Sukacev | A61N 1/28 62/3.5 |
| 4,782,664 A * | 11/1988 | Sterna | F25B 21/02 62/3.3 |
| 7,139,174 B1* | 11/2006 | Nguyen | H01L 23/4006 361/709 |
| 10,182,937 B2* | 1/2019 | Smith | G01K 13/20 |
| 2001/0030037 A1* | 10/2001 | Hellbruck | H01L 23/4093 174/16.3 |

(Continued)

FOREIGN PATENT DOCUMENTS

EP     1701382 A1 *  9/2006  ............... G06F 1/20
WO  WO-2015058605 A1 *  4/2015  ............. A61F 7/007

*Primary Examiner* — Jacob R Crum
*Assistant Examiner* — Matthew Sinclair Muir
(74) *Attorney, Agent, or Firm* — Jose Cherson Weissbrot

(57) ABSTRACT

An adjustable heat exchanger includes a fan assembly, a heatsink assembly, a semiconductor chilling plate and a conduction cooling unit connected in sequence, the conduction cooling unit includes a main conduction cooling plate and a conduction cooling which includes at least one conduction cooling sub-fin. The main conduction cooling plate is connected to the semiconductor chilling plate, the conduction cooling fin is movably connected to an outer peripheral wall of the main conduction cooling plate, the conduction cooling fin extends outward along the center of the main conduction cooling plate, and the conduction cooling fin and the main conduction cooling plate jointly form a contact surface for adapting to a heat-dispersing surface. The present heat exchanger can adapt to hot surfaces with different curved surface radians and form a surrounded fixed structure with the hot surface to make the conduction cooling unit well-contact surfaces with different radians.

6 Claims, 6 Drawing Sheets

(56) References Cited

U.S. PATENT DOCUMENTS

| | | | |
|---|---|---|---|
| 2007/0169316 A1* | 7/2007 | Lu | H04M 1/0212 |
| | | | 16/367 |
| 2008/0037220 A1* | 2/2008 | Hsieh | H05K 7/1061 |
| | | | 257/E23.099 |
| 2011/0071603 A1* | 3/2011 | Moore | A61F 7/007 |
| | | | 607/96 |
| 2013/0116759 A1* | 5/2013 | Levinson | A61F 7/10 |
| | | | 607/104 |
| 2014/0311732 A1* | 10/2014 | Bertelsen | E21B 4/006 |
| | | | 166/77.51 |
| 2018/0107168 A1* | 4/2018 | Han | G06F 1/1633 |
| 2021/0378086 A1* | 12/2021 | Baba | H05K 7/2039 |

\* cited by examiner

US 11,862,534 B2

ADJUSTABLE HEAT EXCHANGER

TECHNICAL FIELD

The present utility model relates to the technical field of heat dissipation devices, and in particular to an adjustable heat exchanger.

BACKGROUND

Thermoelectric cooler has the characteristics of being noise-free and shock-free, requiring no cooling agent, and having small size and light weight, etc., and it is highly reliable during operation, easily operable, and convenient for adjusting cooling capacity, thus mainly applied in occasions requiring low cooling energy consumption and small space, such as hot surfaces of electronic equipment and radio communication equipment. Partial products even can be directly used in human body to dissipate heat of human skin. However, hot surfaces may have various shapes, and the existing thermoelectric coolers mostly have fixed structures and are assembled in a fixed manner. As a result, the existing thermoelectric coolers show poor adaptability, and when mounted on hot surfaces with a certain arc shape, the existing thermoelectric coolers can hardly adapt to the hot surfaces with variable arc shapes during use because the angle cannot be adjusted, thus unable to realize widespread application.

SUMMARY

In order to overcome the above-mentioned defects in the prior art, the technical problem to be solved by the present utility model is to provide an adjustable heat exchanger which can adapt to hot surfaces with different curved surface radians.

In order to solve the above-mentioned technical problems, the technical solution adopted by the present utility model is to provide an adjustable heat exchanger, including a fan assembly, a heatsink assembly, a semiconductor chilling plate and a conduction cooling unit that are connected in sequence. The conduction cooling unit includes a main conduction cooling plate and a conduction cooling fin, and the conduction cooling fin includes at least one conduction cooling sub-fin;

The main conduction cooling plate is connected to the semiconductor chilling plate, the conduction cooling fin is movably connected to an outer peripheral wall of the main conduction cooling plate, the conduction cooling fin extends outward along the center of the main conduction cooling plate, and the conduction cooling fin and the main conduction cooling plate jointly form a contact surface for adapting to a heat-dispersing surface.

Further, the conduction cooling fin includes over two conduction cooling sub-fins that are hinged end to end in sequence, and the conduction cooling sub-fin located at one end of the conduction cooling fin is movably connected to the outer peripheral wall of the main conduction cooling plate.

Further, a connecting groove is provided on the outer peripheral wall of the main conduction cooling plate; and one end of the conduction cooling fin is provided with a connecting shaft matching the connecting groove.

Further, a side wall of the connecting groove is provided with a limiting hole, and a side wall of the connecting shaft is provided with a limiting slot matching the limiting hole at a position corresponding to the position of the limiting hole.

The main conduction cooling plate is provided with a limiting shaft sequentially passing through the limiting hole and the limiting slot, and the axial direction of the limiting shaft is perpendicular to the axial direction of the connecting shaft.

Further, an end surface of the main conduction cooling plate is connected to the semiconductor chilling plate.

Further, the main conduction cooling plate includes a conduction cooling base and a conduction cooling sheet arranged on the conduction cooling base;

The semiconductor chilling plate is connected to the conduction cooling sheet;

The connecting groove is arranged on an outer peripheral wall of the conduction cooling base.

Further, the heatsink assembly includes a heatsink body and a heatsink bracket, and the heatsink bracket is connected to the conduction cooling base;

The heatsink bracket is provided with a through hole matching the semiconductor chilling plate at a position corresponding to the position of the conduction cooling sheet, the semiconductor chilling plate is embedded in the through hole, and two end surfaces of the semiconductor chilling plate contact the heatsink body and the conduction cooling sheet, respectively.

Further, the semiconductor chilling plate is a thermoelectric cooler (TEC) semiconductor sheet.

The advantage of the present utility model lies in that an adjustable heat exchanger is provided. Through adding the conduction cooling fin movably connected on the outer peripheral wall of the main conduction cooling plate, and by adjusting the angle at which the conduction cooling fin is connected to the main conduction cooling plate, the conduction cooling fin and the main conduction cooling plate can jointly form contact surfaces with various radians, as a result, the heat exchanger of the present utility model can adapt to hot surfaces with different curved surface radians, showing a wide range of applicability compared to the traditional fixed integrative structure. Furthermore, the heat exchanger forms a surrounded fixed structure with the hot surface, thereby arriving at a firm installation.

Figure 1:
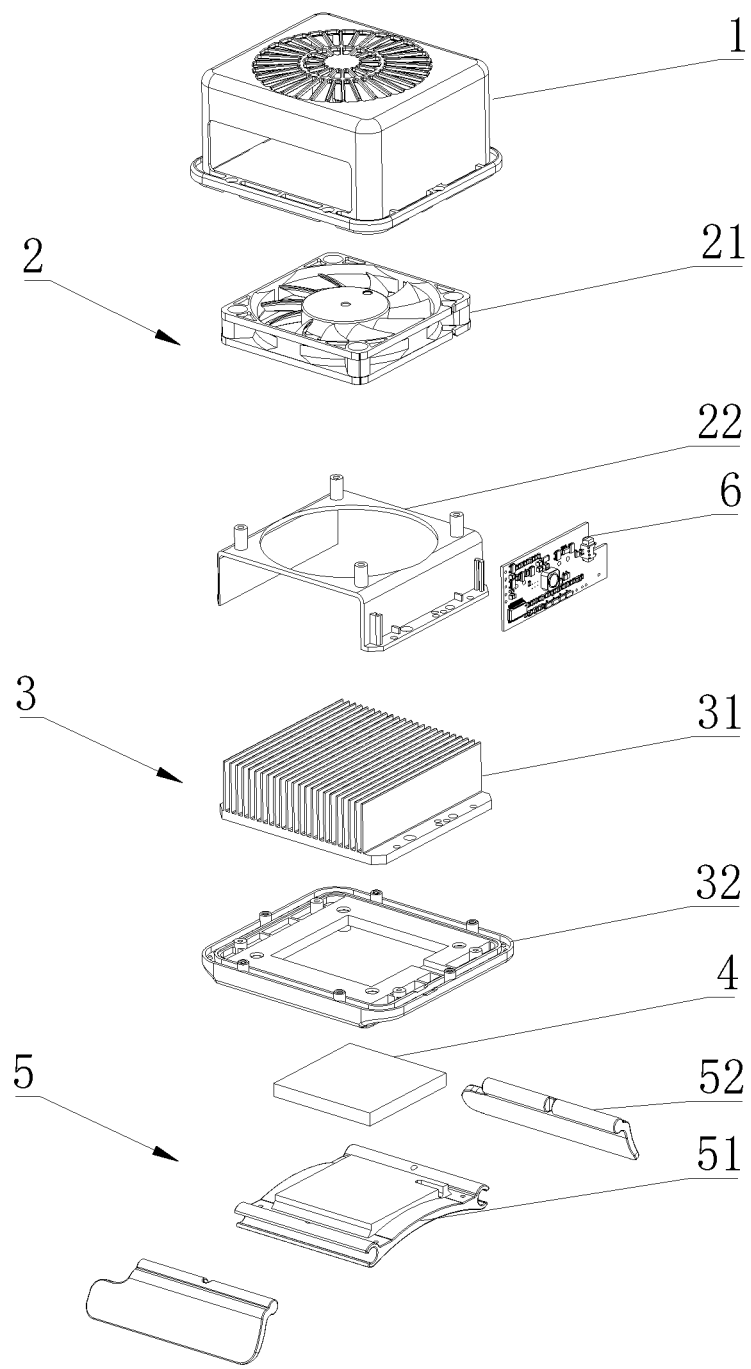
FIG. 1 is an exploded view of an adjustable heat exchanger according to the first embodiment of the present utility model.
Figure 2:
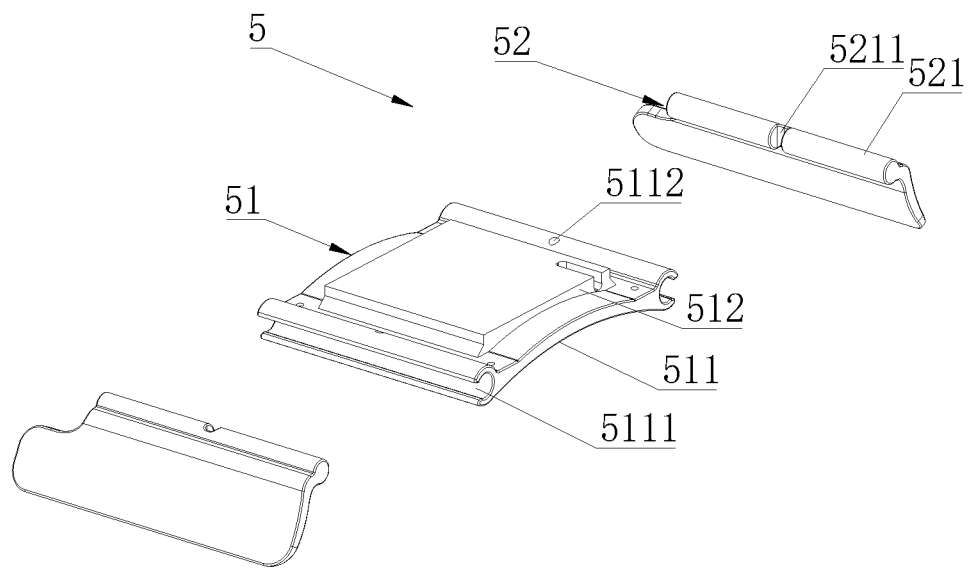
FIG. 2 is an exploded view of a conduction cooling unit of the adjustable heat exchanger according to the first embodiment of the present utility model.
Figure 3:
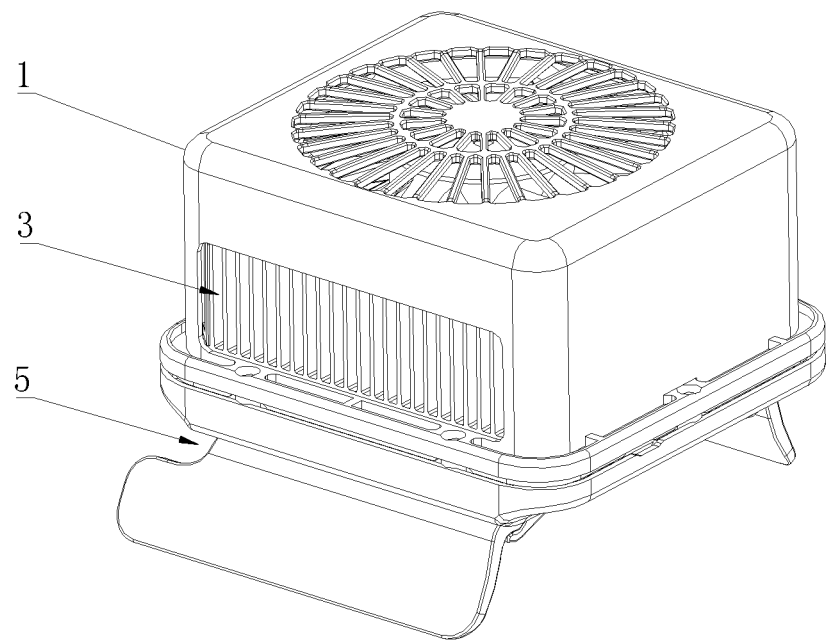
FIG. 3 is a structural diagram of the adjustable heat exchanger according to the first embodiment of the present utility model.
Figure 4:
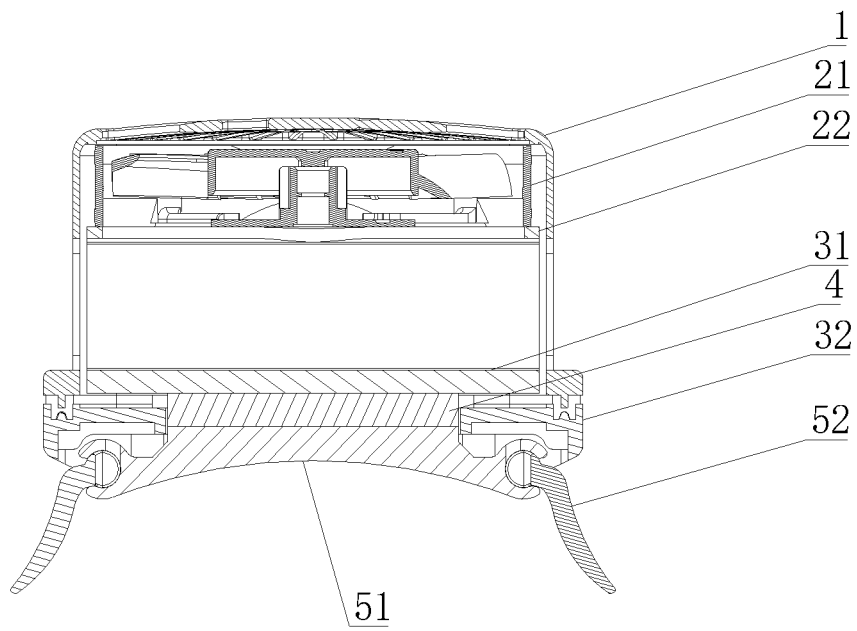
FIG. 4 is a front view of the adjustable heat exchanger according to the first embodiment of the present utility model.
Figure 5:
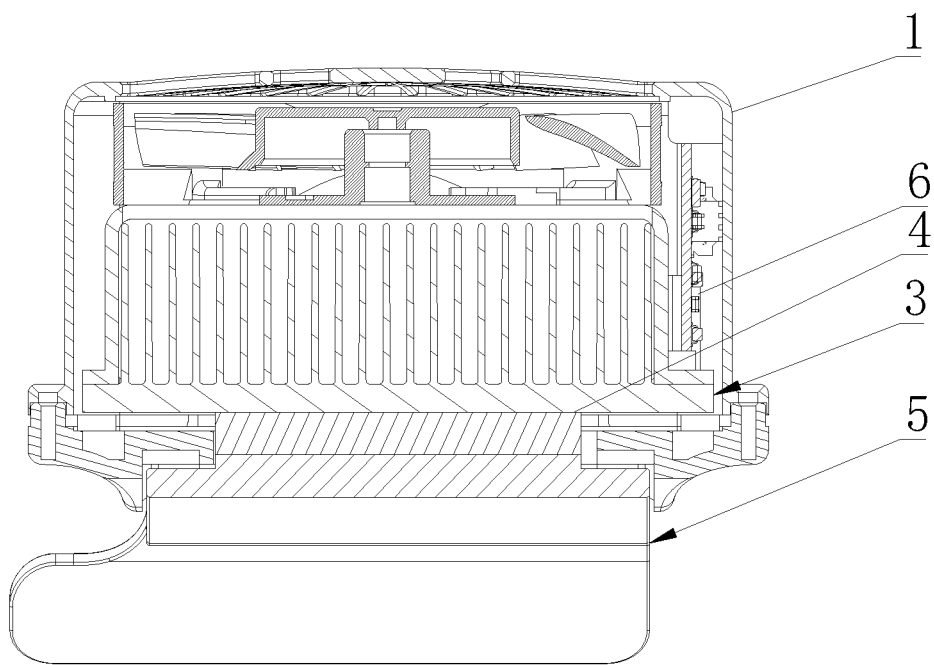
FIG. 5 is a side view of the adjustable heat exchanger according to the first embodiment of the present utility model.

In the drawings:
1. housing;
2. fan assembly; 21. fan body; 22. fan bracket;
3. heatsink assembly; 31. heatsink body; 32. heatsink bracket;
4. semiconductor chilling plate; conduction cooling unit; 51. main conduction cooling plate; 52. conduction cooling fin; 511. conduction cooling base; 512. conduction cooling sheet; 521. connecting shaft; 5111. connecting groove; 5112. limiting hole; 5211. limiting slot; 522. first conduction cooling sub-fin; 523. second conduction cooling sub-fin; 5231. hinge shaft;
6. circuit assembly.

DETAILED DESCRIPTION OF THE EMBODIMENTS

In order to explain the technical contents, the achieved purposes and effects of the present utility model in detail, the following description is given in conjunction with the embodiments and the accompanying drawings.

Referring to FIG. 1 to FIG. 11, the present utility model provides an adjustable heat exchanger, including a fan assembly, a heatsink assembly, a semiconductor chilling plate and a conduction cooling unit that are connected in sequence. The conduction cooling unit includes a main conduction cooling plate and a conduction cooling fin, and the conduction cooling fin includes at least one conduction cooling sub-fin;

The main conduction cooling plate is connected to the semiconductor chilling plate, the conduction cooling fin is movably connected to an outer peripheral wall of the main conduction cooling plate, and the conduction cooling fin extends outward along a center of the main conduction cooling plate, and the conduction cooling fin and the main conduction cooling plate jointly form a contact surface for adapting to a heat-dispersing surface.

It can be seen from the above description that the advantage of the present utility model is to provide the adjustable heat exchanger. Through adding the conduction cooling fin movably connected on the outer peripheral wall of the main conduction cooling plate, and by adjusting the angle at which the conduction cooling fin is connected to the main conduction cooling plate, the conduction cooling fin and the main conduction cooling plate can jointly form contact surfaces with various radians, as a result, the heat exchanger of the present utility model can adapt to hot surfaces with different curved surface radians, and forms a surrounded fixed structure with the hot surface, thereby arriving at a firm installation.

Further, the conduction cooling fin includes over two conduction cooling sub-fins that are hinged end to end in sequence, and the conduction cooling sub-fin located at one end of the conduction cooling fin is movably connected to the outer peripheral wall of the main conduction cooling plate.

It can be seen from the above description that the conduction cooling fin can be composed of multiple conduction cooling sub-fins hinged together, so that the overall length of the conduction cooling fin can be extended by increasing the number of the conduction cooling sub-fins, and the mutually hinged conduction cooling sub-fins enable an adjustment of the overall angle of the conduction cooling fin, thus achieving better adaptability.

Further, a connecting groove is provided on the outer peripheral wall of the main conduction cooling plate; and one end of the conduction cooling fin is provided with a connecting shaft matching the connecting groove.

It can be seen from the above description that the conduction cooling fin is hinged to the main conduction cooling plate by the assembly of the connecting shaft and the connecting groove, so that the conduction cooling fin can move relative to the main conduction cooling plate along the hinge axis direction, forming a surrounded fixation, and improving the stability of installation.

Further, a side wall of the connecting groove is provided with a limiting hole, and a side wall of the connecting shaft is provided with a limiting slot matching the limiting hole at a position corresponding to the position of the limiting hole. The main conduction cooling plate is provided with a limiting shaft sequentially passing through the limiting hole and the limiting slot, and the axial direction of the limiting shaft is perpendicular to the axial direction of the connecting shaft.

It can be seen from the above description that the connecting shaft can be prevented from moving axially to produce displacement by a limit between the connecting shaft and the connecting groove formed by the limiting shaft, thereby improving the stability of equipment installation.

Further, the main conduction cooling plate includes a conduction cooling base and a conduction cooling sheet arranged on the conduction cooling base;

The semiconductor chilling plate is connected to the conduction cooling sheet;

The connecting groove is arranged on an outer peripheral wall of the conduction cooling base.

It can be seen from the above description that the conduction cooling base is used to connect the conduction cooling fin and the hot surface, and the conduction cooling sheet is used to be connected to the semiconductor chilling plate.

Further, the heatsink assembly includes a heatsink body and a heatsink bracket, and the heatsink bracket is connected to the conduction cooling base;

The heatsink bracket is provided with a through hole matching the semiconductor chilling plate at a position corresponding to the position of the conduction cooling sheet, the semiconductor chilling plate is embedded in the through hole, and two end surfaces of the semiconductor chilling plate contact the heatsink body and the conduction cooling sheet, respectively.

It can be seen from the above description that the semiconductor chilling plate is embedded in the through hole, and the two end surfaces of the semiconductor chilling plate respectively extend out of the through hole and are in contact with the heatsink body and the conduction cooling sheet, so as to realize a heat dissipation function.

Further, the semiconductor chilling plate is a TEC semiconductor sheet. Referring to FIG. 1 to FIG. 5, the first embodiment of the present utility model is to provide an adjustable heat exchanger, which can be used in electrical equipment, medical equipment, and experimental equipment and on human body surface to achieve functions of temperature control, heat dissipation adjustment and the like.

The adjustable heat exchanger is arranged on a mounting surface of a hot surface, and the adjustable heat exchanger includes the housing 1, and the fan assembly 2, the heatsink assembly 3, the semiconductor chilling plate 4 and the conduction cooling unit 5 that are respectively covered by and arranged inside the housing. The fan assembly, the heatsink assembly, the semiconductor chilling plate and the conduction cooling unit are connected in sequence from top to bottom.

The conduction cooling unit includes the main conduction cooling plate 51 and any number of conduction cooling fins 52, and the conduction cooling fins are movably connected to the outer peripheral wall of the main conduction cooling plate, respectively. Specifically, the main conduction cooling plate includes the conduction cooling base 511 and the conduction cooling sheet 512 arranged at the center of an upper end surface of the conduction cooling base, and the conduction cooling base and the conduction cooling sheet are integrally formed and connected. A surface of the conduction cooling base is rectangular. A lower end surface of the conduction cooling base is an arc-shaped surface concave inwardly that matches the mounting surface of the hot surface. Preferably, the lower end surface of the conduction cooling base is an arc-shaped surface having U-shaped cross section, and the concave arc adapts to the arc of the hot surface, so that relatively good assembly accuracy is achieved between the heat exchanger of the present utility model and the hot surface. In other embodiments, the surface of the conduction cooling base can also be rectangular, circular, or have other shapes. Two opposite outer peripheral walls of the conduction cooling base are each provided with the connecting groove 5111, and the two connecting grooves are located at two opposite side walls of the U-shaped arc surface of the conduction cooling base.

In the present embodiment, the number of the conduction cooling fins 52 is two, each conduction cooling fin includes one conduction cooling sub-fin, and the two conduction cooling fins are respectively connected to the two connecting grooves. Specifically, the conduction cooling fin is in a shape of an arc hook, one end of the conduction cooling fin is provided with the connecting shaft 521 matching the connecting groove, and the connecting shaft is inserted in the connecting groove to enable the conduction cooling fin to be movably hinged to the main conduction cooling plate. The axial direction of the connecting shaft is perpendicular to the central axis of the main conduction cooling plate, so that the conduction cooling fin can move in a circular motion along the up-down direction of the main conduction cooling plate around the axial direction of the connecting shaft. By adjusting the angle of each conduction cooling fin relative to the main conduction cooling plate, the two conduction cooling fins and the main conduction cooling plate can jointly form an angle-adjustable arc-shaped contact surface, thus being able to adapt to hot surfaces with different curved surface radians, and forming a surrounded fixed structure with the hot surface to achieve a firm installation.

In the present embodiment, the center position of an upper side wall of the connecting groove is further provided with the limiting hole 5112, and the limiting hole is preferably a screw hole. A side wall of the connecting shaft of the conduction cooling fin is provided with the limiting slot 5211 matching the limiting hole at a position corresponding to the position of the limiting hole. The main conduction cooling plate is provided with a limiting shaft sequentially passing through the limiting hole and the limiting slot, and the axial direction of the limiting shaft is perpendicular to the axial direction of the connecting shaft. Preferably, the limiting shaft is a screw, the screw is connected to the screw hole, and the threaded end of the screw is inserted into the limiting slot to form an axial limit, which prevents the conduction cooling fin from moving axially.

In the present embodiment, the semiconductor chilling plate is a TEC semiconductor sheet.

In the present embodiment, the fan assembly includes the fan body 21 and the fan bracket 22, and the heatsink assembly includes the heatsink body 31 and the heatsink bracket 32. The fan bracket is U-shaped, and the U shape of the fan bracket has an opening facing downward. The fan is arranged on an upper end surface of the fan bracket, and the upper end surface of the fan bracket is provided with vent holes at positions corresponding to the positions of blades of the fan body. A mounting base for mounting the control circuit assembly 6 is further provided on an outer peripheral side wall of the fan bracket.

The central position of the heatsink bracket is provided with a rectangular through hole, and the semiconductor chilling plate is embedded in the through hole. The heatsink is arranged on an upper end surface of the heatsink bracket and contacts an upper end surface of the semiconductor cooling fin, and two side walls of the U shape of the fan bracket are connected to the heatsink bracket to enable the heatsink to be covered by and arranged inside the opening of the U shape of the fan bracket. A lower end surface of the heatsink bracket is connected to the conduction cooling base, and a lower end surface of the semiconductor cooling fin contacts the conduction cooling sheet on the conduction cooling base.

In the present embodiment, one end of the housing has an opening, and the opening of the housing faces downward. A top of the housing is provided with a heat dissipation hole, and side walls of the housing corresponding to the opening of the housing are connected to the heatsink bracket.

Figure 6:
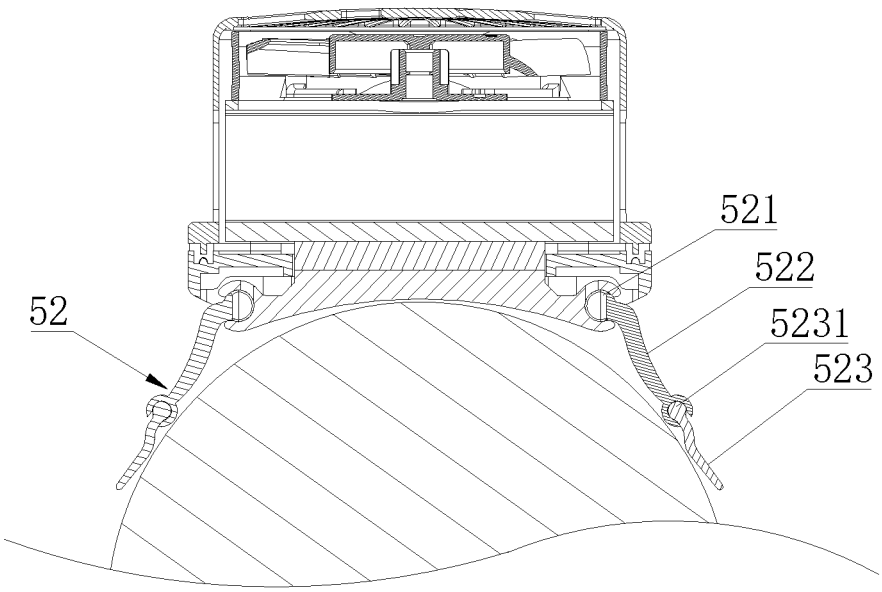
FIG. 6 is a cross-sectional view of an adjustable heat exchanger according to the second embodiment of the present utility model in an assembly state.
Figure 7:
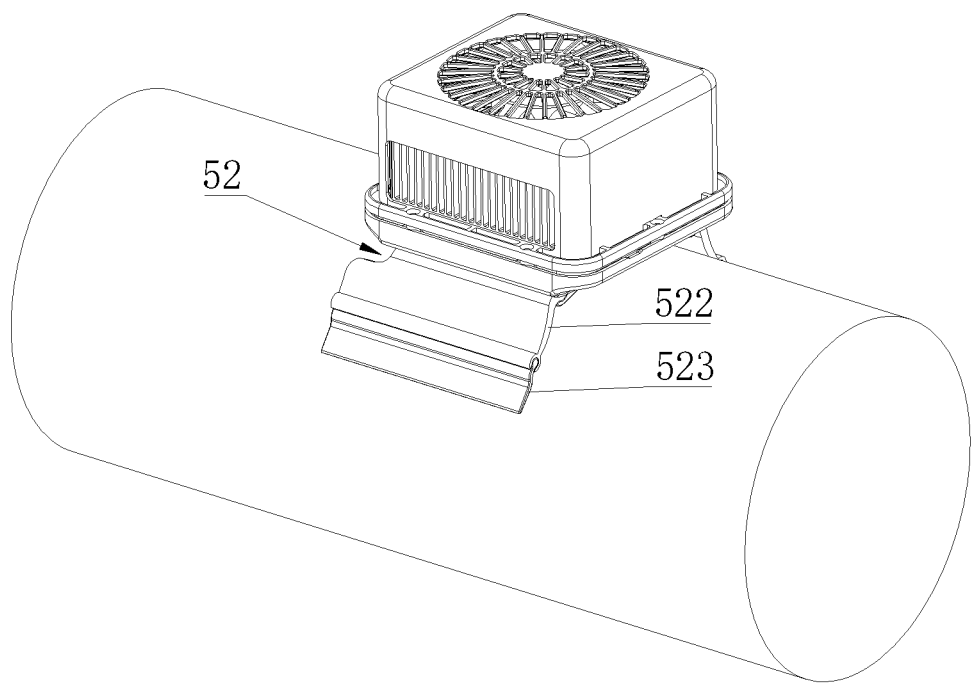
FIG. 7 is a schematic diagram of the adjustable heat exchanger according to the second embodiment of the present utility model in an assembly state.

Referring to FIG. 6 to FIG. 7, the second embodiment of the present utility model is as follows.

The second embodiment differs from the first embodiment in that the structure of the conduction cooling fin is further improved. Specifically:

The conduction cooling fin includes two conduction cooling sub-fins that are hinged end to end in sequence, and the conduction cooling sub-fin at one end of the conduction cooling fin is movably connected to the outer peripheral wall of the main conduction cooling plate. Preferably, each conduction cooling fin of the present embodiment includes two conduction cooling sub-fins hinged to each other, and the conduction cooling fin, from one end to the other end, sequentially includes the first conduction cooling sub-fin 522 and the second conduction cooling sub-fin 523. The connecting shaft is arranged at one end of the first conduction cooling sub-fin and hinged to the connecting groove, the other end of the first conduction cooling sub-fin is provided with a hinge groove, one end of the second conduction cooling sub-fin is provided with the hinge shaft 5231 matching the hinge groove, and the other end of the second conduction cooling sub-fin is provided with a support foot contacting the hot surface.

In other embodiments, the conduction cooling fin may also be composed of multiple conduction cooling sub-fins hinged together, so that the overall length of the conduction cooling fin can be extended by increasing the number of the conduction cooling sub-fins, and the mutually hinged conduction cooling sub-fins make the overall angle of the conduction cooling fin adjustable, resulting in better adaptability.

Figure 8:
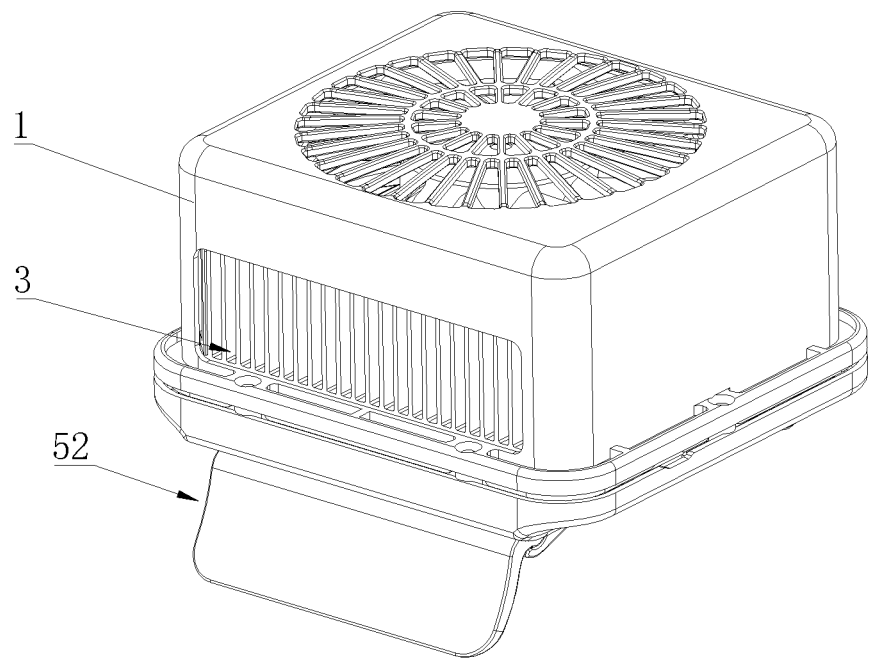
FIG. 8 is a top perspective view of an adjustable heat exchanger according to the third embodiment of the present utility model.
Figure 9:
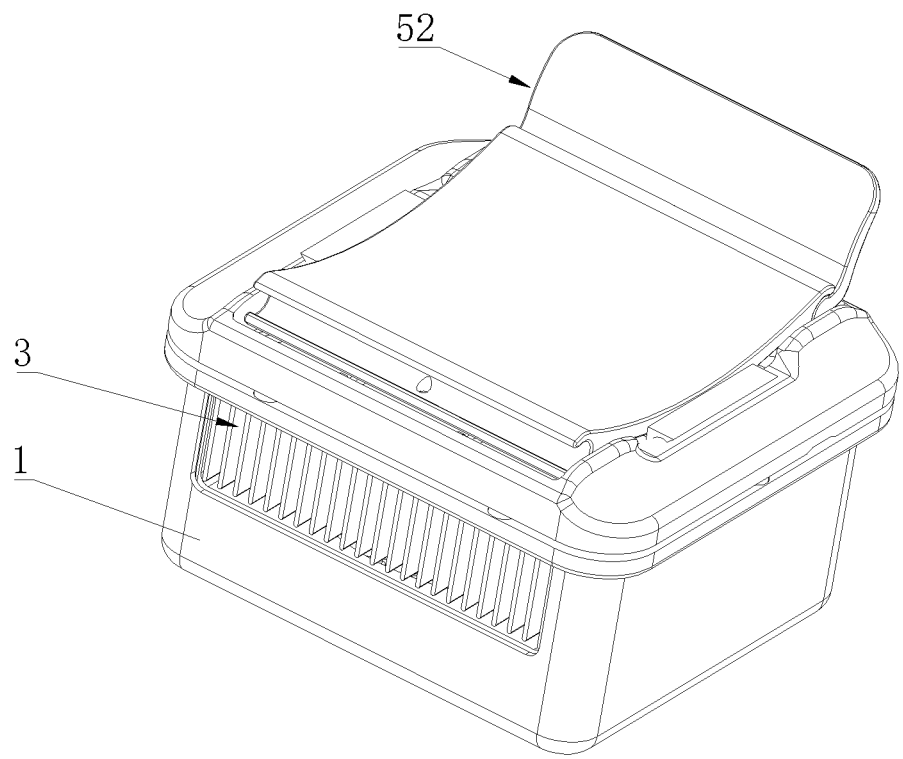
FIG. 9 is a bottom perspective view of the adjustable heat exchanger according to the third embodiment of the present utility model.

Referring to FIG. 8 to FIG. 9, the third embodiment of the present utility model is as follows.

The third embodiment differs from the first embodiment in that the structure of the conduction cooling fin is further improved. Specifically:

Only one conduction cooling fin 52 is provided, and the conduction cooling fin includes only one conduction cooling sub-fin. The single conduction cooling fin 52 is arranged on one side of the main conduction cooling plate 51 and is hinged to the main conduction cooling plate. The structure is relatively simple.

Figure 10:
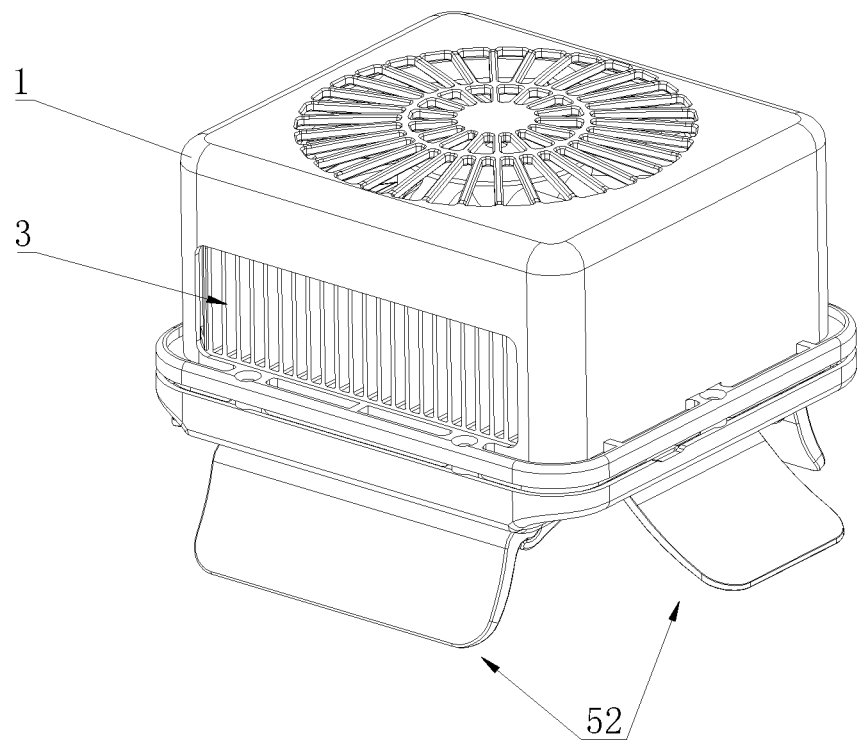
FIG. 10 is a top perspective view of an adjustable heat exchanger according to the fourth embodiment of the present utility model.
Figure 11:
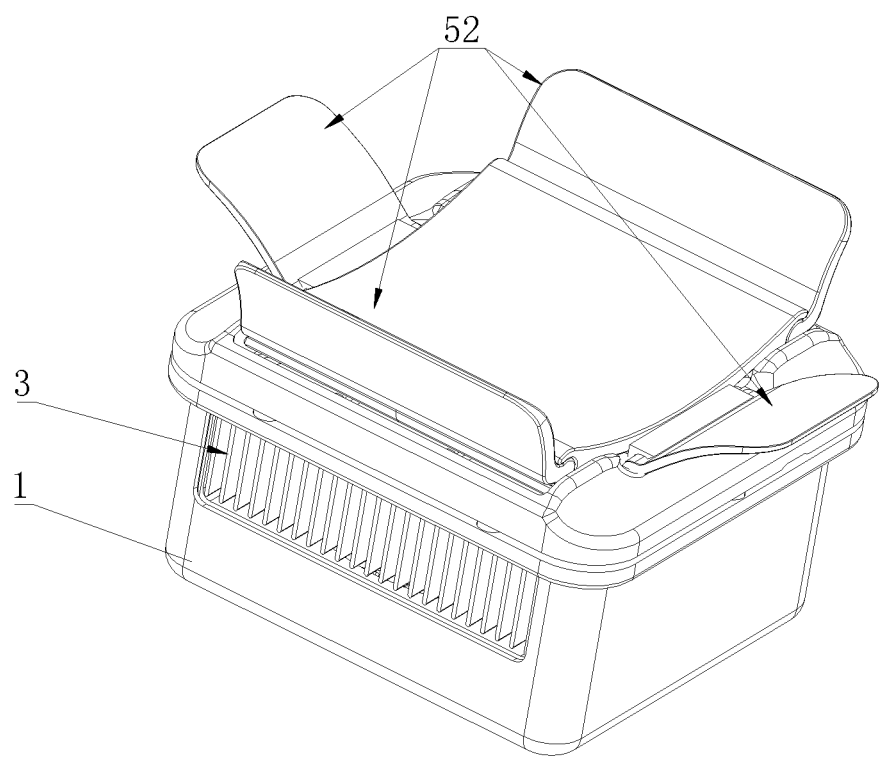
FIG. 11 is a bottom perspective view of the adjustable heat exchanger according to the fourth embodiment of the present utility model.

Referring to FIG. 10 to FIG. 11, the fourth embodiment of the present utility model is as follows.

The fourth embodiment differs from the first embodiment in that the structure of the conduction cooling fin is further improved. Specifically:

Four conduction cooling fins 52 are provided, and each of conduction cooling fins includes only one conduction cooling sub-fin. The four conduction cooling fins 52 are arranged surrounding the main conduction cooling plate 51 and are hinged to the main conduction cooling plate. The structure can be applied to a convex surface.

In summary, the present utility model provides the adjustable heat exchanger. Through adding the conduction cooling fin movably connected on the outer peripheral wall of the main conduction cooling plate, and by adjusting the angle at which the conduction cooling fin is connected to the main conduction cooling plate, the conduction cooling fin and the main conduction cooling plate can jointly form arc-shaped contact surfaces with various radians, as a result, the heat exchanger of the present utility model can adapt to hot surfaces with different curved surface radians, and form a surrounded fixed structure with the hot surface, thereby arriving at a firm installation.

The above descriptions are only the embodiments of the present utility model and do not limit the scope of the present utility model. Any equivalent transformation made based on the contents of the specification and drawings of the present utility model, or direct or indirect application in related technical fields, shall be regarded as falling within the protection scope of the present utility model.

What is claimed is:

1. An adjustable heat exchanger, comprising a fan assembly, a heatsink assembly, a semiconductor chilling plate and a conduction cooling unit connected in sequence, wherein the conduction cooling unit comprises a main conduction cooling plate and a conduction cooling fin, and the conduction cooling fin comprises over two conduction cooling sub-fins hinged end to end in sequence, and the conduction cooling sub-fin located at one end of the conduction cooling fin is movably connected to an outer peripheral wall of the main conduction cooling plate;

the main conduction cooling plate is connected to the semiconductor chilling plate, the conduction cooling fin is movably connected to -an-the outer peripheral wall of the main conduction cooling plate, the conduction cooling fin extends outward along a center of the main conduction cooling plate, and the conduction cooling fin and the main conduction cooling plate jointly form a contact surface for adapting to a heat-dispersing surface.

2. The adjustable heat exchanger according to claim 1, wherein a connecting groove is provided on the outer peripheral wall of the main conduction cooling plate; and the one end of the conduction cooling fin is provided with a connecting shaft matching the connecting groove.

3. The adjustable heat exchanger according to claim 2, wherein a side wall of the connecting groove is provided with a limiting hole, and a side wall of the connecting shaft is provided with a limiting slot matching the limiting hole at a position corresponding to a position of the limiting hole.

4. The adjustable heat exchanger according to claim 2, wherein the main conduction cooling plate comprises a conduction cooling base and a conduction cooling sheet arranged on the conduction cooling base;

the semiconductor chilling plate is connected to the conduction cooling sheet;

the connecting groove is arranged on an outer peripheral wall of the conduction cooling base.

5. The adjustable heat exchanger according to claim 4, wherein the heatsink assembly comprises a heatsink body and a heatsink bracket, and the heatsink bracket is connected to the conduction cooling base;

the heatsink bracket is provided with a through hole matching the semiconductor chilling plate at a position corresponding to a position of the conduction cooling sheet, the semiconductor chilling plate is embedded in the through hole, and two end surfaces of the semiconductor chilling plate contact the heatsink body and the conduction cooling sheet, respectively.

6. The adjustable heat exchanger according to claim 1, wherein the semiconductor chilling plate is a thermoelectric cooler (TEC) semiconductor sheet.

* * * * *